(12) United States Patent
Fukushima et al.

(10) Patent No.: US 7,632,609 B2
(45) Date of Patent: Dec. 15, 2009

(54) FABRICATION METHOD OF PHOTOMASK-BLANK

(75) Inventors: Noriyasu Fukushima, Niigata (JP); Hiroki Yoshikawa, Niigata (JP); Hideo Kaneko, Niigata (JP); Yukio Inazuki, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 587 days.

(21) Appl. No.: 11/545,451

(22) Filed: Oct. 11, 2006

(65) Prior Publication Data

US 2007/0092807 A1   Apr. 26, 2007

(30) Foreign Application Priority Data

Oct. 24, 2005 (JP) ............................. 2005-308618
Oct. 24, 2005 (JP) ............................. 2005-308622

(51) Int. Cl.
*G03F 1/14* (2006.01)
(52) U.S. Cl. .............................................. 430/4; 430/5
(58) Field of Classification Search .................. 430/4–5
See application file for complete search history.

(56) References Cited

U.S. PATENT DOCUMENTS 5,999,254 A   12/1999   Seibert et al.

2004/0105670 A1   6/2004   Kusuda

FOREIGN PATENT DOCUMENTS

| EP | 1 426 820 | 6/2004 |
|---|---|---|
| JP | 7-140635 | 6/1995 |
| JP | 07-140635 | 6/1995 |
| JP | 9-306921 | 11/1997 |
| JP | 11-260719 | 9/1999 |
| JP | 2004-223 | 1/2004 |
| JP | 2004-179510 | 6/2004 |
| JP | 2004-199035 | 7/2004 |
| JP | 2004-247339 | 9/2004 |
| JP | 2007-114680 | 5/2007 |
| JP | 2007-114681 | 5/2007 |

*Primary Examiner*—Mark F Huff
*Assistant Examiner*—John Ruggles
(74) *Attorney, Agent, or Firm*—Finnegan, Henderson, Farabow, Garrett & Dunner LLP (57) ABSTRACT

A susceptor having the most basic structure has a three-layer structure including a first and a second transparent quartz part and an opaque quartz part sandwiched therebetween. For example, the opaque quartz part is made of "foamed quartz". In addition, the opacity of the opaque quartz part to flash light is determined to fall within an appropriate range based on the material or thickness of the opaque quartz part, taking into consideration the composition or thickness of a thin film formed on the substrate and various conditions concerning the energy of the irradiation light during flash light irradiation or the like. The stack structure may be composed of a stack of a plurality of opaque quartz layers having different opacities.

14 Claims, 10 Drawing Sheets

PRIOR ART

FABRICATION METHOD OF PHOTOMASK-BLANK

BACKGROUND OF THE INVENTION

1. Field of the Invention

The present invention relates to a fabrication method of a photomask-blank. In particular, it relates to a fabrication technique of a photomask-blank, which is a base material for a photomask, which is used for fine processing of a semiconductor integrated circuit, a charge-coupled device (CCD), a color filter for a liquid crystal device (LCD), a magnetic head and the like.

2. Description of the Related Art

The packaging density of semiconductor integrated circuits is becoming higher, and the wavelength of exposure light of exposure apparatus used in the lithography technique for fabrication of semiconductor integrated circuits or the like is becoming shorter in order to improve the resolution. According to the lithography roadmap of International Technology Roadmap for Semiconductor (ITRS) updated in 2004, the dominant light sources are shifting from ultraviolet light sources of g-line (wavelength $\lambda=436$ nm) or i-line ($\lambda=365$ nm) to those of shorter wavelengths, specifically, far-ultraviolet light sources of KrF line ($\lambda=248$ nm) or ArF line ($\lambda=193$ nm).

Furthermore, in 2007, the half pitch will be 65 nm (hp65), and ArF immersion lithography will be adopted. And in 2010, the half pitch will be 45 nm (hp45), and a combination of $F_2$ or ArF immersion lithography and a resolution enhancement technology (RET) will be adopted.

In this way, it is expected that the demand for the photomask (and the photomask-blank as the base material thereof) in the most advanced technology will be assured until 2010. Furthermore, a possibility is pointed out that the lithography using a photomask will be used for a half pitch of 32 nm (hp32), which is expected to be realized until around 2013, and a half pitch of 22 nm (hp22), which is expected to be realized until around 2016.

According to the Rayleigh's equation for resolution evaluation, the resolvable line width RP and the depth of focus DOF are expressed by the following formulas, where $k_1$ and $k_2$ are proportionality factors.

$$RP = k_1 \lambda / NA \quad (1)$$

$$DOF = k_2 \lambda / NA^2 \quad (2)$$

Thus, in order to make the lithography technique finer, in addition to the shorter wavelength described above, a higher numerical aperture (NA) is required.

According to the "immersion technique" that has recently become a focus of attention as a technique for increasing the NA, the numerical aperture is increased by filling the space between a wafer to be exposed to light and a lens placed closest to the wafer with a liquid having a refractive index (n) higher than that of the environmental atmosphere (gas), thereby magnifying the NA value by a factor of the refractive index (n) of the liquid.

Supposed that the divergence of light flux focused on one point on the wafer to be exposed to light is denoted by $\pm\theta$, and the refractive index of the space between the wafer and the lens is $n_0$, the numerical aperture NA is expressed as $NA = n_0 * \sin\theta$. Typically, the space between the wafer and the lens is filled with air ($n_0 = 1$), so that $NA = \sin\theta$. On the other hand, if the space between the wafer to be exposed to light and the lens is filled with a liquid having a refractive index of n, $NA = n * \sin\theta$. Thus, the numerical aperture NA is increased, and accordingly the resolvable line width RP is reduced.

To achieve a small resolvable line width RP, as can be seen from the formula (1) described above, it is also effective to reduce the proportionality factor $k_1$. An RET to achieve this may be a "modified illumination" in which the shape of the effective light source is modified from the simple circular shape to another shape or a "multiple exposure" such as FLEX in which the wafer is exposed to light by using a single mask and moving the wafer along the optical axis of the projection optical system.

On the other hand, as can be seen from the formula (2) described above, although reduction in wavelength of the exposure light is effective for reduction in resolvable line width RP, it has a problem that it results in a reduction in depth of focus DOF, which in turn adversely affects the production yield. In other words, reduction in wavelength of the exposure light results in a reduction in factor k and thus is advantageous for transfer of a fine structure. However, reduction in wavelength of the exposure light results also in a reduction in depth of focus DOF and thus has a problem that it causes a focus error to reduce the production yield if the flatness of the photomask is insufficient.

One of methods of solving this problem is a phase-shift method. According to the phase-shift method, a phase-shift mask is used, in which patterns are formed in such a manner that patterns adjacent to each other have phases different by approximately 180 degrees from each other.

That is, since the phase-shift film provided on the phase-shift mask shifts the phase of the exposure light by 180 degrees, the light passing through the region in which the phase-shift film pattern is formed and the light passing through the region in which no phase-shift film is formed have an optical intensity of 0 at the boundary between the regions, so that the resulting optical intensity distribution exhibits an abrupt change at the boundary.

As a result, a high DOF can be achieved, and the image contrast is improved.

The phase-shift mask includes a Levenson type and a half-tone type, for example. In particular, the DOF can be significantly improved by using a half-tone phase-shift mask.

As a half-tone phase-shift mask, a single-layer mask having a relatively simple structure has been proposed, and there have been proposed single-layer phase-shift masks that have a phase-shift film made of molybdenum silicide oxide (MoSiO) and molybdenum silicide oxynitride (MoSiON) (see Japanese Patent Laid-Open No.7-140635 (prior-art literature 1), for example).

According to a method of fabricating such a phase-shift mask, a phase-shift mask blank is patterned by lithography. The lithography method involves applying a resist to a phase-shift mask blank, exposing a desired part of the resist to an electron beam or ultraviolet rays, and then developing the resist to expose the exposed part of the surface of the phase-shift film. Then, the exposed phase-shift film is removed by etching using the patterned resist film as a mask to expose the substrate surface, and then, the resist film is peeled off. In this way, a phase-shift mask is provided.

In the case where a plurality of photomask are used to form a multilayer device, a high alignment precision is needed. The alignment precision is inevitably raised as the pattern becomes finer.

However, if a stress is already accumulated in the thin film formed on the substrate at the stage of the photomask-blank, some of the stress accumulated in the film is released in the course of the pattern writing including the resist application step, the exposure step, the development step, the etching step and the resist peel-off step, thereby causing a distortion in the resulting photomask. Such a distortion reduces the alignment precision of the photomask and causes a defect of the circuit pattern to be written.

The level of distortion depends on the pattern to be written and the magnitude of the stress accumulated in the film, and it is extremely difficult to control or release the distortion during the fabrication process of the photomask.

Of course, such a problem does not arise if each thin film is formed under a condition that the stress in the thin film is substantially 0. However, it is virtually impossible to achieve this condition, because it is extremely difficult to find the fabrication process condition that satisfies both the film deposition condition that assures required properties of a thin film as an optical film and the condition for forming a thin film having a low stress.

Thus, a step of depositing a thin film under a condition that assures required properties of a thin film and a step of reducing the stress in the thin film have to be separately provided.

Generally, in the photomask-blank, a thin film, such as a phase-shift film, is deposited by sputtering. However, a stress occurs in the film during the film deposition process, and the stress causes a distortion of the substrate and a warpage of the photomask-blank. To solve the problem, there has been proposed a technique that irradiates a light-absorbing thin film, such as a phase-shift film, with light of a predetermined energy density from a flash lamp to control the stress in the film, thereby reducing the warpage of the photomask-blank (see Japanese Patent Laid-Open No. 2004-0223 (prior-art literature 2)).

As means of externally imparting energy for reducing the stress in the thin film, a hot plate, a heater, a halogen lamp, an infrared lamp, a furnace, rapid thermal anneal (RTA) and the like are also possible. However, these means have a problem that the substrate itself is damaged because the temperature of the substrate is increased by excessively imparted energy or the productivity is reduced because the processing time is elongated. Thus, the light irradiation by means of a flash lamp described in the prior-art literature 2 is preferred.

According to the technique described in the prior-art literature 2, by irradiating the thin film formed on the photomask-blank with light having an appropriate amount of energy from the flash lamp, the stress in the film on the photomask-blank (in particular, the half-tone phase-shift mask) can be reduced to 0.2 μm or less in terms of warpage 0.1 μm or less under a more appropriate condition). As for the optical property of the half-tone phase-shift film, an in-plane phase difference distribution of 0.63 degrees and an in-plane transmittance distribution of 0.13% are achieved.

However, in the case where the processing using the flash lamp is performed as described in the prior-art literature 2, the flash light irradiation causes generation of particles in the chamber by the mechanism described later, and the particles adhere to the substrate and cannot be removed by the subsequent cleaning. Thus, there is a problem that the number of particle-caused defects of the photomask-blank increases.

SUMMARY OF THE INVENTION

The present invention has been devised in view of such problems, and an object thereof is to provide a photomask-blank and a photomask that have a reduced number of particle-caused defects and fabrication methods thereof. In order to attain the object, the present invention has a constitution described below.

According to a first aspect of the present invention, there is provided a fabrication method of a photomask-blank, comprising: a step of irradiating an optical film formed on a transparent substrate with flash light, in which the irradiation is performed with the transparent substrate being mounted on a substrate supporting member made of a glass material that is opaque to the flash light, the substrate supporting member has a stack structure having n layers of light-transmitting materials (n is a natural number equal to or greater than 2), and at least one of the n layers has an opacity to the flash light that is different from that of the other layers.

For example, the stack structure comprises a stack of a layer that is transparent to the flash light and a layer that is opaque to the flash light, and the glass material described above is opaque quartz glass, for example. In addition, the opaque layer described above may be made of foamed glass, for example.

Preferably, over a wavelength range of 300 to 600 nm, the opacity of the substrate supporting member to the flash light is equal to or higher than 10% in terms of reflectance measured using an integrating sphere.

In addition, preferably, the substrate supporting member has a maximum surface roughness ($R_{max}$) of 15 μm or less.

According to the first aspect of the present invention, the optical film on the transparent substrate is irradiated with flash light with the transparent substrate being mounted on the substrate supporting member made of a glass material that is opaque to the flash light. Since the transmittance of the flash light of the substrate supporting member is low, the part of the flash light that contributes to the stress control of the thin film formed on the substrate surface increases.

As a result, since the optical energy can be efficiently used for the stress control of the thin film, the energy of the irradiation light can be lowered, and the probability of generation of particles from the inner surface of the chamber can be reduced.

In addition, the reduction of the energy of the irradiation flash light has another advantage that the in-plane distribution of the optical property of the thin film can be made uniform.

According to a second aspect of the present invention, there is provided a fabrication method of a photomask-blank, comprising: a step of irradiating an optical film formed on a transparent substrate with flash light, in which the irradiation is performed with the transparent substrate being mounted on a substrate supporting member, the substrate supporting member having an excavation and a side wall part surrounding the excavation, and the side wall part being made of a glass material that is opaque to the flash light applied to the optical film, a substrate mounting region of the excavation has a stack structure having n layers of light-transmitting materials (n is a natural number equal to or greater than 2), and at least one of the n layers has a transmittance to the flash light that is different from that of the other layers.

For example, the glass material described above is opaque quartz glass.

Preferably, the height of the side wall part of the substrate supporting member described above from the excavation is equal to or greater than the thickness of the substrate, and the side wall part described above may be composed of a stack of a layer that is transparent to the flash light and a layer that is opaque to the flash light.

Preferably, over a wavelength range of 300 to 600 nm, the opacity of the substrate mounting region of the excavation described above to the flash light is equal to or lower than 85% in terms of transmittance measured using an integrating sphere.

Preferably, the substrate supporting member has a maximum surface roughness ($R_{max}$) of 15 μm or less.

According to the second aspect of the present invention, when irradiating the optical film on the transparent substrate with flash light, a susceptor having an excavation that serves as a base on which the substrate is mounted is used. Thus, oblique incident flash light is diffuse-reflected from the opaque quartz part of the side wall part surrounding the excavation of the susceptor. Therefore, the flash light can be reduced that is incident directly on a chamfered tapered edge of the substrate and reflected from the back surface of the substrate, and the flash light can be reduced that is obliquely incident on the side wall part of the susceptor, applied directly to the surface of the excavation and then reflected therefrom into the substrate.

Thus, the excessive optical energy imparted to the thin film by the light that is incident on the back surface of the thin film on the principal plane of the substrate is reduced.

As a result, since the optical energy can be efficiently used for the stress control of the thin film, the energy of the irradiation light can be lowered, and the probability of generation of particles from the inner surface of the chamber can be reduced.

In addition, the reduction of the energy of the irradiation flash light has another advantage that the in-plane distribution of the optical property of the thin film can be made uniform.

BRIEF DESCRIPTION OF THE DRAWINGS

FIG. 4A shows a particle distribution before the flash light irradiation, and FIG. 4B shows a particle distribution after the flash light irradiation;

FIG. 5A shows a particle distribution before the flash light irradiation, and FIG. 5B shows a particle distribution after the flash light irradiation;

FIGS. 6A and 6B are diagrams for illustrating behaviors of light from a flash lamp after being perpendicularly incident on a substrate mounted on a susceptor and passing through the substrate with regard to susceptors of different structures.

FIGS. 7A to 7C are diagrams for illustrating exemplary shapes and structures of the susceptor formed using an opaque material.

DETAILED DESCRIPTION OF THE INVENTION

In the following, best modes for carrying out the present invention will be described with reference to the drawings.

As a result of the earnest study to solve the problem that flash light irradiation causes generation of particles in a chamber, and the particles once deposited on a substrate cannot be completely removed by subsequent cleaning, so that particle-caused defects in a photomask-blank increase, the inventors have attained the knowledge described below.

First, the surfaces in the chamber (that is, the inner wall of the chamber itself and the surfaces of jigs in the chamber) are a source of particles. Second, generation of particles can be effectively suppressed by reducing reflection of the light of the flash lamp from a susceptor mounted on the substrate. Third, further investigations are needed concerning the management criterion of the cleanness of the photomask-blank substrate and the cleaning condition required to meet the criterion.

It can be considered that deposition of particles on the substrate for the photomask-blank in the chamber occurs as a result of introduction of particles into the chamber along with the substrate, generation of particles caused by flash light irradiation in the chamber, and accumulation of particles in the chamber, for example.

According to the above-described approach to reduce a stress in a film by using flash lamp irradiation, a film (phase-shift film, for example) capable of absorbing light emitted from a flash lamp is deposited on a transparent substrate of synthetic quartz glass, calcium fluoride or the like, and then the film is irradiated with light of the flash lamp having a controlled amount of energy to control the stress in the film. Then, as required, another film is deposited on the light-absorbing film to form a photomask-blank.

The light-absorbing film described above may be a phase-shift film, a light shielding film or an antireflection film formed on the photomask-blank. However, this approach is suitable for a phase-shift mask blank that has a phase-shift film (in particular, a half-tone phase-shift film). If the light-absorbing film described above is a half-tone phase-shift film, a light shielding film, an antireflection film or the like is formed after the flash light irradiation, and a half-tone phase-shift mask blank is provided.

The flash lamp is a light source that emits successive flashes of light of a wide wavelength range that have a short duration and a high illuminance. For example, there is a xenon flash lamp. Therefore, unlike a laser light source, the light-absorbing film need not be a film that highly absorbs light of a particular wavelength. Therefore, restrictions on the composition or the like of the film whose stress can be controlled by the flash-light-irradiation approach are extremely loose, and the flash-light-irradiation approach has a wide variety of applications.

In addition, the substrate need not be scanned with irradiation light, and the surface of the substrate can be completely irradiated with light (energy can be imparted to the substrate) in a short time. Furthermore, since the light of the flash lamp has a spectrum over a wide wavelength range, various irradiation effects of light of different wavelengths can be achieved.

It is considered that, when the light-absorbing film, such as the half-tone phase-shift film, is irradiated with such flash light, the absorption of the irradiation light, an abrupt temperature change or the like causes a change in film composition, coupling state of atoms or the like, thereby achieving a stress reduction. However, the substrate alone is not irradiated with the light, but the inner wall of the chamber and the surface of a jig in the chamber (collectively referred to as in-chamber surface) are also irradiated with the light.

When the in-chamber surface is irradiated with such an instantaneous light and absorbs the energy thereof, the condition of the surface changes because of abrupt expansion or contraction of a jig, for example, and a local fracture occurs to produce particles. These particles are accumulated in the chamber and float in the chamber. The particles are deposited on the substrate or damage the substrate surface, leading to a defect of the photomask-blank.

Thus, effective measures to be taken to reduce the occurrence of a particle-caused defect are as follows: first, the in-chamber surface is made less capable of producing particles; second, the flash irradiation condition is optimized so that particles are hard to be produced; third, reflection of the flash lamp light in the chamber (in particular, reflection from the susceptor) is reduced; and fourth, introduction of particles into the chamber along with the substrate is reduced.

In the following, the present invention devised based on the knowledge described above will be described with reference to examples.

EXAMPLE 1

Reduction In Roughness of in-chamber Surface

This example relates to a technique of reducing generation of particles in a flash light processing step by reducing the roughness of an in-chamber surface.

The investigation by the inventors has proven that, when the inner wall of a chamber or the surface of a jig in the chamber is irradiated with flash light, multiple reflection or the like occurs depending on the level of roughness (unevenness) of the surface, and the reflection light causes a fracture of an uneven part of the in-chamber surface, thereby producing fine particles.

In order to prevent a local fracture of the in-chamber surface due to expansion or contraction of the material thereof, quartz glass can be effectively used.

Thus, in the following description, it is supposed that the chamber and jigs, such as a susceptor, housed in the chamber are made of quartz glass, unless otherwise specified. As described in detail later, the quartz glass has another advantage that the amount of optical energy imparted to a substrate can be easily adjusted because its transmittance of flash light can be easily controlled.

Figure 1A:
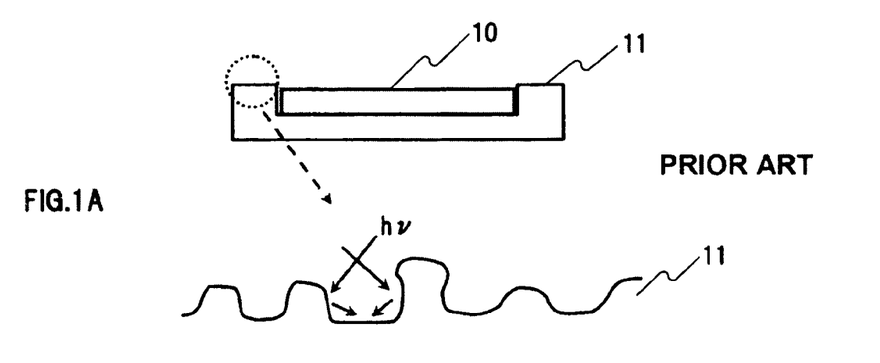
FIGS. 1A and 1B are conceptual diagrams for illustrating multiple reflection of flash light from an uneven part of an in-chamber surface.
Figure 1B:
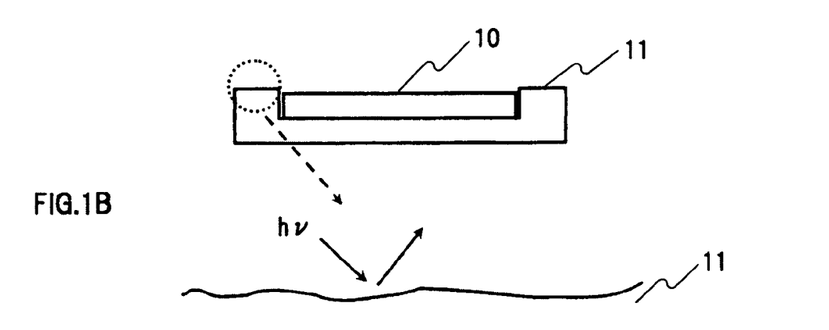

FIGS. 1A and 1B are conceptual diagrams for illustrating multiple reflection of flash light from an uneven part of the in-chamber surface. These drawings illustrate multiple reflection of flash light occurring on the surface of a susceptor, which is a jig used in a chamber or in other words a holder on which a substrate is mounted during flash light processing.

In these drawings, reference numeral 10 denotes a photomask-blank substrate, and reference numeral 11 denotes a susceptor on which the substrate 10 is mounted. The susceptor shown in FIG. 1A is a conventional one that has a significant level of surface roughness. The susceptor shown in FIG. 1B is a one according to the present invention that is reduced in surface roughness and has a smooth surface.

The conventional susceptor shown in FIG. 1A is formed by grinding a piece of quartz, which is a base material of the susceptor, and then subjecting the ground piece of quartz to a hydrofluoric acid treatment. The susceptor has an average surface roughness ($R_a$) of about 3 μm and a maximum surface roughness ($R_{max}$) of about 20 μm.

Table 1 shows a summary of values of the average surface roughness ($R_a$) and the maximum surface roughness ($R_{max}$) of susceptors that were used in this example for examining the correlation between the level of surface roughness and the amount of defects occurring in the substrate. The conventional susceptor has an average surface roughness ($R_a$) of 2.85 μm and a maximum surface roughness ($R_{max}$) of 17.24 μm. On the other hand, the susceptors according to the present invention have average surface roughnesses ($R_a$) of 2.11 μm and 0.22 μm and maximum surface roughnesses ($R_{max}$) of 12.06 μm and 1.69 μm, respectively.

[Table 1]

TABLE 1

| Susceptor | $R_a$(μm) | $R_{max}$(μm) |
| --- | --- | --- |
| Conventional item | 2.85 | 17.24 |
| Item 1 of present invention | 2.11 | 12.06 |
| Item 2 of present invention | 0.22 | 1.69 |

A half-tone phase-shift film of MoSiON was deposited on a 6-inch rectangular quartz substrate by reactive DC sputtering using a MoSi target. The resulting substrate was placed on each of the susceptors having such surface roughnesses, heated to a temperature of 80 degrees Celsius, and then irradiated with light having an energy density of 16 J/cm$^2$ emitted from a xenon flash lamp.

Figure 2A:
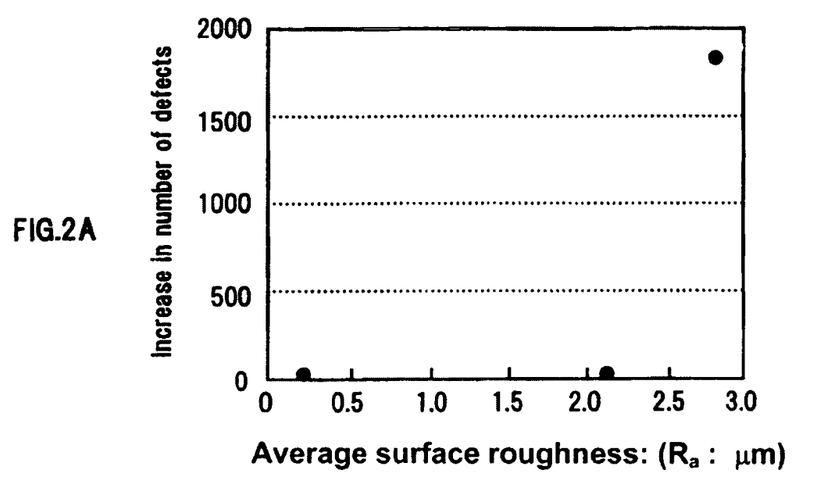
FIGS. 2A and 2B are plots of the increase in number of defects observed on a substrate after flash light irradiation, with the horizontal axes representing the average surface roughness ($R_a$) and the maximum surface roughness ($R_{max}$) of susceptors, respectively.
Figure 2B:
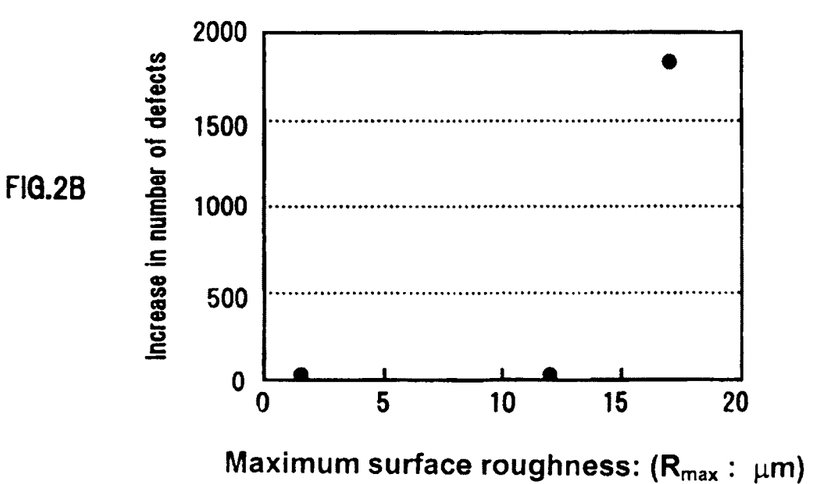

FIGS. 2A and 2B are plots of the increase of defects observed on the substrate after the flash light irradiation, in which the horizontal axes represent the average surface roughness ($R_a$) and the maximum surface roughness ($R_{max}$) of the susceptors, respectively. In addition, Table 2 shows a summary of the results. The inspection device used for defect measurement was GM-1000 manufactured by Hitachi High-Technologies Corporation.

[Table 2]

TABLE 2

| Susceptor | $R_a$(μm) | $R_{max}$(μm) | Increment |
| --- | --- | --- | --- |
| Conventional item | 2.85 | 17.24 | 1848 |
| Item 1 of present invention | 2.11 | 12.06 | 13 |
| Item 2 of present invention | 0.22 | 1.69 | 21 |

As can be seen from these results, for the conventional susceptor having an average surface roughness ($R_a$) of 2.85 μm and a maximum surface roughness ($R_{max}$) of 17.24 μm, the number of defects was increased by more than 1800 by the flash light irradiation.

This can be considered as follows: since the conventional susceptor has an extremely high surface roughness ($R_{max}$ of 17.24 μm), more multiple reflections of the flash light occur on the uneven part of the surface as shown in FIG. 1A, and the uneven part absorbs the flash light with a high energy density, so that the susceptor surface is locally fractured to produce particles, and the particles fly onto the substrate to cause defects in the substrate.

To the contrary, as shown in FIG. 1B, in the cases where the flash light processing is performed using the susceptors according to the present invention that have average surface roughnesses ($R_a$) of 2.11 μm and 0.22 μm and maximum surface roughnesses ($R_{max}$) of 12.06 μm and 1.69 μm, which are less than 15 μm, respectively, no multiple reflection (shown in FIG. 1A) of the flash light applied to the surface of the susceptors 11 occurs on the surface, so that no local fracture occurs on the susceptor surface due to absorption of the flash light energy by the uneven part.

As a result, the number of defects was increased by about 10 to 20 by the flash light processing, which is not more than one hundredth of that in the case of the conventional susceptor.

That is, when irradiating the thin film on the photomask-blank with the flash lamp light of an appropriate amount of energy to control (release) the distortion in the film, the generation of particles from the material in the chamber can be substantially reduced by reducing the roughness (unevenness) of the in-chamber surface to 15 μm or less in terms of maximum surface evenness ($R_{max}$).

FIGS. 1A and 1B illustrate only the roughness of the susceptor surface. However, according to the present invention, not only the susceptor surface but also the inner surface of the chamber itself and the surfaces of any jigs in the chamber that can be irradiated with the flash light are smoothed so that the surfaces have a maximum surface roughness $R_{max}$ of 15 μm or less.

There is no particular restriction on the method of smoothing the surface. For example, fire polishing or mechanical polishing may be used.

The flash light irradiation using the chamber and jigs having such smooth surfaces is particularly useful for fabrication of a photomask-blank that is a base material of a photomask and is required to have fewer defects for fine patterning. For example, the photomask-blank is a half-tone phase-shift mask blank. In this case, a translucent film (half-tone phase-shift film) is deposited on a transparent substrate of quartz or the like, and the phase-shift film is irradiated with flash light having an optical energy equal to or less than a predetermined amount. Limiting the optical energy to a predetermined amount or less is to facilitate control of the distortion (stress) accumulated in the phase-shift film.

The predetermined amount of the energy of the irradiation light depends on the required optical property of the photomask-blank to be fabricated. In the case of a phase-shift mask, the predetermined amount depends on the composition, thickness or the like of the phase-shift mask to be irradiated with flash light. This is because, if the irradiation light has an excessively high energy, the film quality improvement is degraded, and the film can be damaged by excessive irradiation.

For example, the phase-shift film of the photomask-blank may be an amorphous silicon film, a metal compound film containing oxygen, nitrogen, carbon or the like. In particular, a phase-shift film comprising one or more layers containing silicon, a metal other than silicon, and one or more of oxygen, nitrogen and carbon has a high controllability of optical property.

The metal other than silicon contained in the phase-shift film may be W, Mo, Ti, Ta, Zr, Hf, Nb, V, Co, Cr or Ni. However, in order to reduce the warpage of the film after flash light irradiation and to improve the chemical resistance, a Mo-based phase-shift film is preferred.

For example, the phase-shift film may be composed of molybdenum silicide oxide (MoSiO), molybdenum silicide nitride (MoSiN), molybdenum silicide carbide (MoSiC), molybdenum silicide oxynitride (MoSiON), molybdenum silicide oxycarbide (MoSiOC), or molybdenum silicide oxynitride carbide (MoSiONC). Such molybdenum-silicide-based phase-shift film can be deposited by reactive sputtering using MoSi or the like as a target.

In the case where the phase-shift film irradiated with flash light is a molybdenum-silicide-based film such as those described above, the film specification may be designed for KrF laser exposure, ArF laser exposure or $F_2$ laser exposure. Within a wavelength range of 200 to 1100 nm, the transmittance increases in the order of the film for KrF exposure, the film for ArF exposure, and the film for $F_2$ exposure. That is, since the light absorption efficiency of the film depends on the property thereof, the irradiation light has an appropriate range for each film, the energy of the irradiation light has to be increased in the order of the film for KrF exposure, the film for ArF exposure and the film for $F_2$.

Specifically, for a phase-shift film having a transmittance of 5 to 7% with respect to light having a wavelength of a KrF laser (248 nm), the energy of the irradiation flash light measured with a calorimeter is a predetermined amount of 21.5 $J/cm^2$ or lower. For a phase-shift film having a transmittance of 5 to 7% with respect to light having a wavelength of an ArF laser (193 nm), the energy of the irradiation flash light is a predetermined amount of 32.5 $J/cm^2$ or lower. For a phase-shift film having a transmittance of 5 to 7% with respect to light having a wavelength of a $F_2$ laser (157 nm), the energy of the irradiation flash light is a predetermined amount of 41.5 $J/cm^2$ or lower.

Through observation using a Nomarski microscope, it is confirmed that if the phase-shift film is irradiated with light having an energy higher than the value described above, a part of the phase-shift film on the surface of the substrate is damaged.

The unit emission time (a time required for one light emission) of the flash lamp of the present invention falls within a range of 100 μsec to 1 sec. As the irradiation time of the flash lamp becomes shorter, the energy density becomes lower, and the wavelength of the irradiation light shifts to shorter wavelengths. As the irradiation time of the flash lamp becomes longer, the energy density becomes higher, and the wavelength of the irradiation light shifts to longer wavelengths. In this example, in view of the energy density and the wavelength range of the irradiation light, an irradiation time of about 1 msec was adopted.

EXAMPLE 2

Investigation of Pressure in Chamber

This example relates to the influence of the pressure in a chamber during flash light irradiation on the generation of particles.

The investigation by the inventors has proven that generation of particles can be effectively suppressed by reducing the pressure in the chamber in which flash light irradiation occurs.

According to prior art, when performing flash light irradiation, the chamber is once evacuated, nitrogen gas is introduced into the chamber through a filter capable of removing particles having a diameter of 0.1 μm, for example, and then flash light irradiation is performed at atmospheric pressure while flowing the clean nitrogen gas. However, it has been proven by experiment that, if the flash light irradiation is performed at atmospheric pressure in this way, a large amount of defects occur with a certain probability (frequency). The inventors have considered this phenomenon as described below.

Figure 3A:
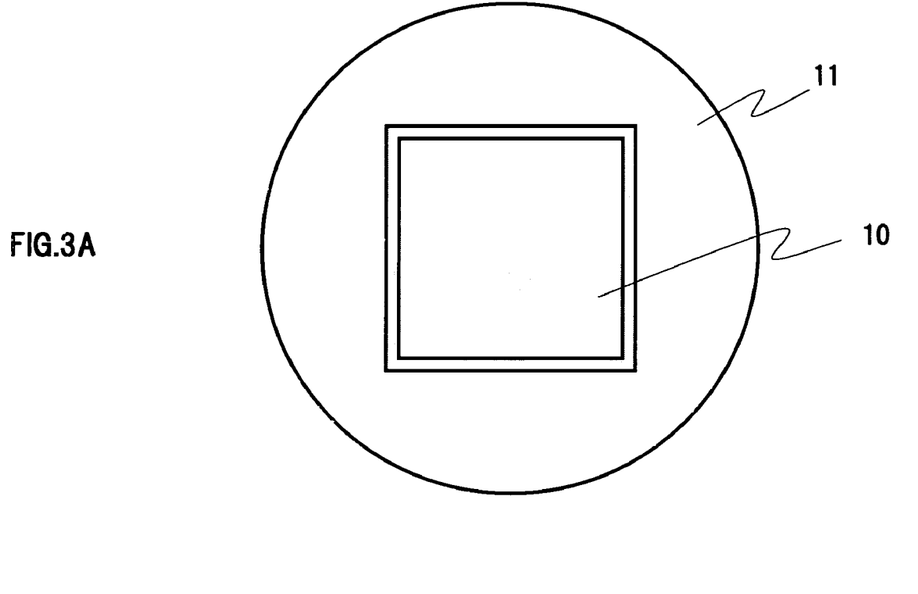
FIGS. 3A and 3B are a top view for illustrating a substrate mounted on a susceptor during flash light irradiation and a partial cross-sectional view of an end of the substrate housed in the susceptor, respectively.
Figure 3B:
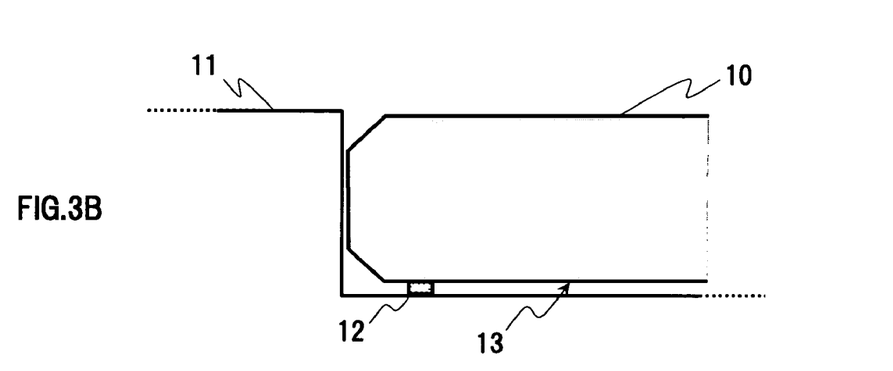

FIGS. 3A and 3B are diagrams illustrating a substrate mounted on a susceptor during flashlight irradiation. FIG. 3A is a top view, and FIG. 3B is a partial cross-sectional view of an end of a substrate 10 housed in a susceptor 11.

As shown in FIG. 3A, the substrate 10, which is made of a transparent material such as quartz glass, is housed an excavation in the susceptor 11, which is also made of quartz glass or the like, with an edge part thereof supported by a substrate supporting member 12 on the susceptor 11 at the back surface thereof. The substrate supporting member 12 is intended to make the substrate 10 float slightly in the susceptor 11 in order to prevent the back surface of the substrate 10 from being scratched during the flash light irradiation. Thus, there is a slight clearance 13 between the back surface of the substrate 10 and the susceptor 11.

Figure 4A:
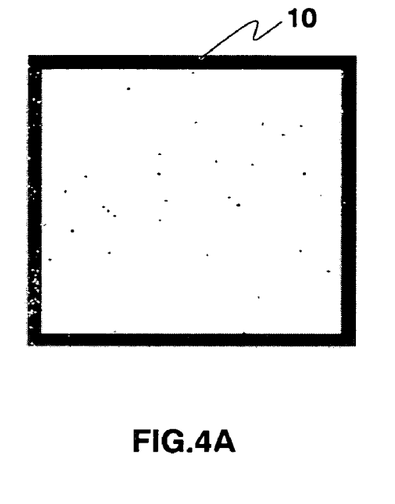
FIGS. 4A and 4B are diagrams showing spatial distributions of particles on the substrate surface before and after the flash light irradiation in the atmosphere.
Figure 4B:
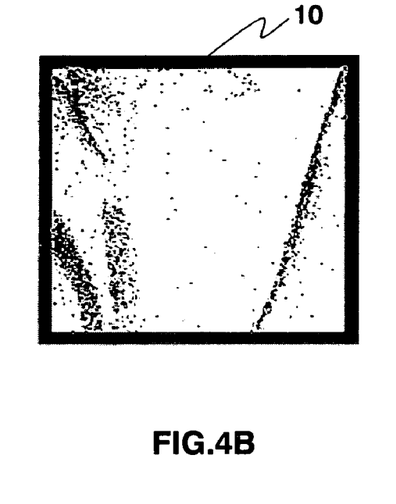

FIGS. 4A and 4B are top views of the substrate showing spatial distributions of particles on the substrate surface before and after the flash light irradiation in the atmosphere. FIG. 4A shows a particle distribution before the flash light irradiation, and FIG. 4B shows a particle distribution after the flash light irradiation.

As can be seen from these drawings, if the flash light irradiation is performed with the pressure in the chamber set at atmospheric pressure, the number of particles on the substrate surface significantly increases.

This can be considered as follows: the gas in the clearance 13 between the susceptor 11 and the back surface of the substrate 10 absorbs the irradiation light of the flash lamp and abruptly expands, and as a result, the substrate 10 is displaced in the susceptor 11 and collides with the susceptor 11 to produce particles; and at the same time, the gas absorbing the flash light and expanding forms a flow from the back surface of the substrate 10 to the front surface, and the gas flow delivers the particles, which will cause defects, to the front surface of the substrate 10.

Figure 5A:
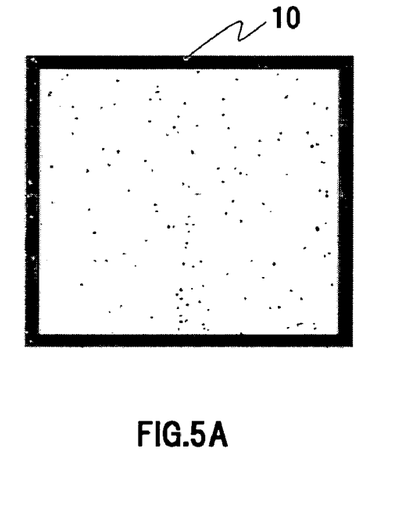
FIGS. 5A and 5B are diagrams showing spatial distributions of particles on the substrate surface before and after the flash light irradiation in a vacuum.
Figure 5B:
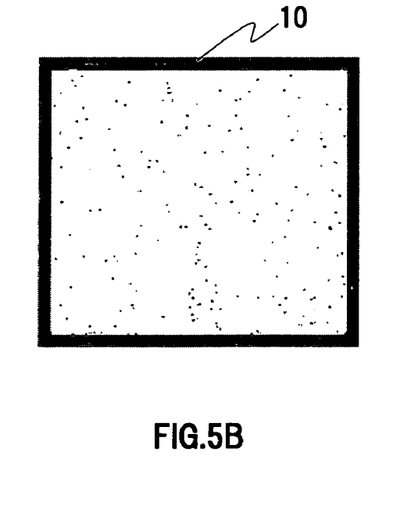

FIGS. 5A and 5B are diagrams showing spatial distributions of particles on the substrate surface before and after the flash light irradiation in a vacuum (a decompressed state). FIG. 5A shows a particle distribution before the flash light irradiation, and FIG. 5B shows a particle distribution after the flash light irradiation.

As can be seen from these drawings, if the flash light irradiation is performed with the chamber kept in a vacuum (decompressed) state, little increase in number of particles on the substrate surface is observed.

This can be considered as follows: since the chamber is kept in a vacuum (decompressed) state, there is no gas that absorbs the irradiation light of the flash lamp in the clearance 13 between the susceptor 11 and the back surface of the substrate 10, and therefore, the collision of the substrate 10 with the susceptor 11, which causes generation of particles, does not occur, and the gas flow, which delivers the particles remaining in the chamber to the surface of the substrate, does not occur.

The results shown in FIGS. 4A, 4B, 5A and 5B were obtained by measurement using M1320 manufactured by Lasertec Corporation.

The particles delivered to the front surface of the substrate 10 collide with the surface of the substrate 10, damaging the surface or adhering to the surface of the substrate 10. Of course, such a mechanical damage cannot be removed by the subsequent cleaning. In addition, it is difficult to completely remove the particles adhering to the surface of the substrate 10 by cleaning.

Table 3 shows levels of particles on the surfaces of substrates after the flash light irradiation and after the subsequent substrate cleaning. Samples A-1 and A-2 are irradiated with flash light in the atmosphere as with the conventional technique, and samples B-1 and B-2 are irradiated with flash light in a vacuum (a decompressed state). This table shows a summary of the number of particles on the substrate surface for the samples after the flash light irradiation and for the samples after the cleaning following the flash light irradiation.

The defect measurement (particle counting) of the samples was performed using Magics1302 manufactured by Lasertec Corporation.

[Table 3]

TABLE 3

| Sample | After irradiation | After cleaning |
|---|---|---|
| A-1 | 54 | 4 |
| A-2 | 32 | 16 |
| B-1 | 5 | 2 |
| B-2 | 2 | 2 |

As can be seen from these results, the particles adhering to the substrate during the flash light irradiation can be removed to some extent by the subsequent cleaning. However, it is difficult to completely remove the particles. Thus, in order to fabricate a photomask-blank having fewer defects, minimizing the number of particles adhering to the substrate during the flash light irradiation is extremely important. The flash light irradiation in a vacuum (decompressed) chamber has proven to be an effective approach to achieve this.

EXAMPLE 3

Structure 1 of Susceptor

This example relates to a structure of a susceptor on which a substrate is mounted during flash light irradiation, which is intended to reduce particles generated during flash light irradiation by minimizing the amount of irradiation light of a flash lamp.

Figure 6A:
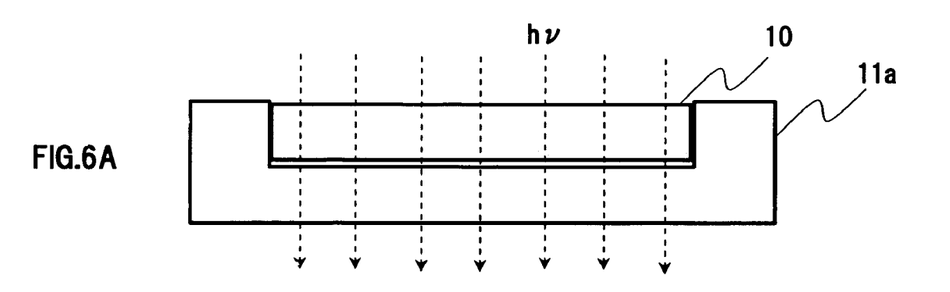
FIG. 6A shows a susceptor made only of transparent quartz.
Figure 6B:
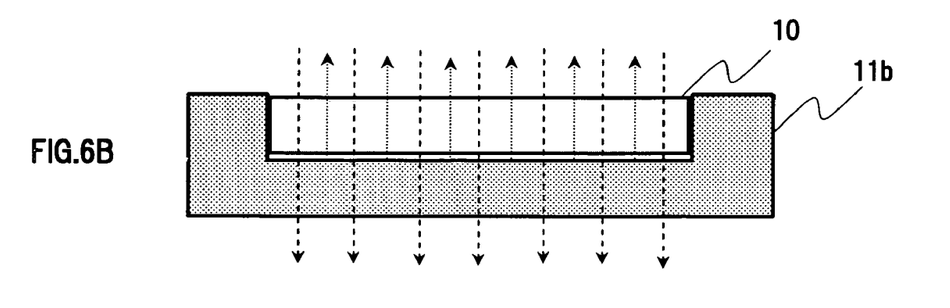
FIG. 6B shows a susceptor made only of opaque quartz.

FIGS. 6A and 6B are diagrams for illustrating behaviors of light from a flash lamp after being perpendicularly incident on a substrate mounted on a susceptor and passing through the substrate with regard to susceptors of different structures. The susceptor shown in FIG. 6A is made only of transparent quartz, and the susceptor shown in FIG. 6B s made only of opaque quartz.

The term "susceptor" in this specification is used in a broad sense to refer to a member for holding a substrate for a member on which a substrate is mounted). Therefore, the shape or the like of the susceptor is not limited to that illustrated in these drawings. In addition, quartz glass, which is described as the material of the susceptor, is only an example, and the susceptor may be made of a glass material other than quartz.

If a susceptor 11a made of a material transparent to light of a wavelength of the irradiation flash light is used as shown in FIG. 6A, the flash light applied perpendicularly to the substrate 10 passes through the substrate 10 and then passes through the susceptor 11a in the thickness direction, rather than being reflected from the surface of the susceptor 11a facing the back surface of the substrate 10.

Thus, most energy of the flash light passing through the substrate 10 passes through the susceptor 11a in the thickness direction. As a result, the part of the flash light that is reflected from the surface of the susceptor 1a facing the back surface of the substrate 10 to enter the substrate 10 again and contributes to the stress control of a thin film formed on the front surface (upper surface in the drawing) of the substrate 10 is inevitably extremely small.

In order to impart an optical energy required for the stress control of the thin film to the thin film under such a condition, the energy of the incident light has to be increased. However, as described earlier, irradiation with flash light of high energy causes an increase in probability of generation of particles from the in-chamber surface.

On the other hand, as shown in FIG. 6B, if a susceptor 11b made of a material opaque to the flash light (opaque quartz, such as foamed glass, in this example) is used, the susceptor 11b has a low transmittance of flash light (in other words, a high reflectance). As a result, the flash light applied perpendicularly to the substrate 10 is reflected from the surface of the susceptor 11b facing the back surface of the substrate 10 and enters the substrate 10 again, so that the part of the flash light that contributes to the stress control of the thin film formed on the upper surface of the substrate 10 increases.

As a result, the optical energy can be efficiently used for the stress control of the thin film, and thus, the energy of the irradiation light can be reduced, and the probability of generation of particles from the in-chamber surface can be reduced.

In addition, the reduction in energy of the irradiation flash light has another advantage that the in-plane distribution of the optical property of the thin film can be effectively made uniform.

As described earlier, if the susceptor surface is smoothed to have a roughness (maximum surface roughness) of 15 μm or less, it is possible to more effectively reduce the generation of particles when the flash light applied perpendicularly to the substrate 10 is reflected from the surface of the susceptor 11b facing the back surface of the substrate 10.

According to a first aspect of the present invention, over a wavelength range of 300 to 600 nm, a preferred opacity of the susceptor is 10% or higher (more preferably, 20% or higher) in terms of reflectance measured using an integrating sphere (for example, ultraviolet and visible spectrophotometer UV-2400PC manufactured by Shimadzu Corporation).

According to a second aspect of the present invention, over a wavelength range of 300 to 600 nm, a preferred opacity of the susceptor is 85% or lower (more preferably 80% or lower, or further preferably 75% or lower) in terms of transmittance measured using an integrating sphere (for example, ultraviolet and visible spectrophotometer UV-2400PC manufactured by Shimadzu Corporation).

As a method of controlling the "opacity", the surface of a transparent substrate may be appropriately roughened by an HF treatment, the foam size or density of a substrate made of foamed glass may be adjusted, or the thickness of a foamed glass layer of a multilayer substrate comprising a stack of a transparent glass layer and the foamed glass layer may be adjusted.

Figure 7A:
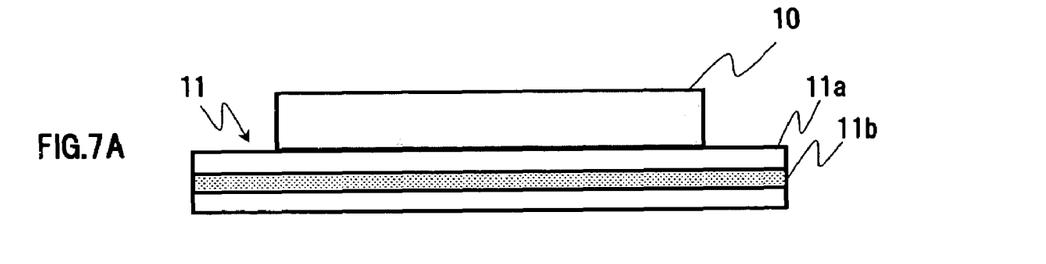
FIG. 7A shows a susceptor (type 1) that is constituted only by a base on which a substrate is mounted.
Figure 7B:
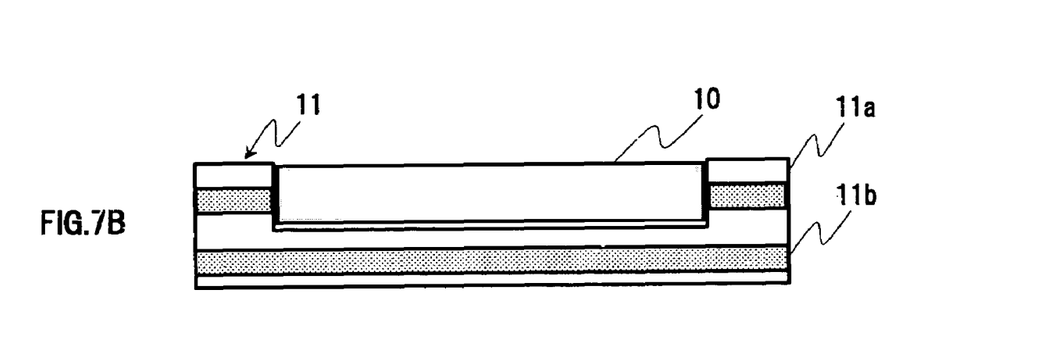
FIGS. 7B and 7C show a susceptor (type 2) that has an excavation that serves as a base for the substrate.
Figure 7C:
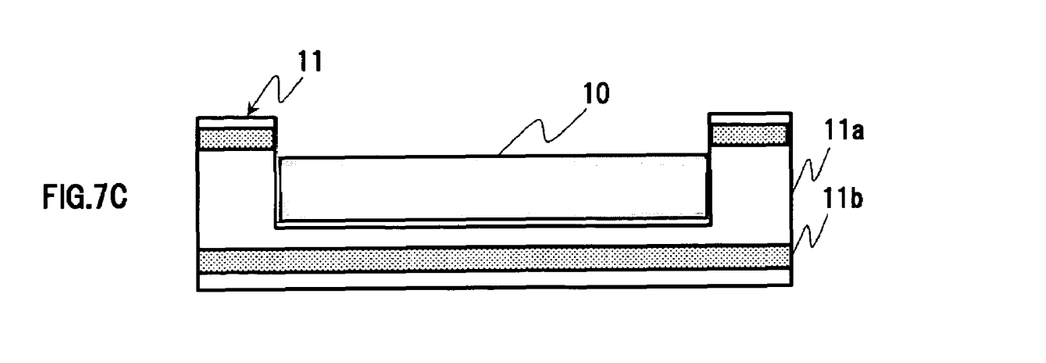

FIGS. 7A to 7C are diagrams for illustrating exemplary shapes and structures of the susceptor formed using an opaque material. Although the susceptor may have various shapes and structures other than those shown in these drawings, Figure shows a susceptor 11 (type 1) that is constituted only by a base on which the substrate 10 is mounted, and FIGS. 7B and 7C show a susceptor 11 (type 2) that has an excavation that serves as abase for the substrate 10. In these drawings, white-colored parts denoted by reference numeral 11a are parts made of transparent quartz, and parts denoted by reference numeral 11b are parts made of opaque quartz (such as foamed quartz glass).

First, the susceptor 11 shown in FIG. 7A, which has the most basic structure, will be described. The susceptor 11 has a three-layer structure comprising a first transparent quartz part, a second transparent quartz part and an opaque quartz part 11b sandwiched between the transparent quartz parts.

As described earlier, the opaque quartz part 11b is made of "foamed quartz", for example. In addition, the opacity of the opaque quartz part 11b to flash light is determined to fall within an appropriate range based on the material or thickness of the opaque quartz part 11b, taking into consideration the composition or thickness of a thin film formed on the substrate 10 and various conditions concerning the energy of the irradiation light during flash light irradiation or the like.

Similarly, in the susceptors having the structures shown in FIGS. 7B and 7C, that is, the structures in which an excavation formed in the susceptor serves as a base on which the substrate is mounted, the reduction in energy of the irradiation flash light is achieved. For these structure, the opacity of the opaque quartz part 11b to flash light is determined to fall within an appropriate range by taking into consideration the composition or thickness of a thin film formed on the substrate 10 and various conditions concerning the energy of the irradiation light during flash light irradiation or the like.

The susceptors having the structures in which the excavation serves as a base on which the substrate is mounted has another advantage in addition to the reduction of the energy of the irradiation flash light, which will be described in detail later with regard to Example 4.

For convenience, FIGS. 7A to 7C show only the stack structures that comprise the transparent quartz part 11a and the opaque quartz part 11b. However, the transparent quartz part may not be used, and the stack structure may be composed of a stack of a plurality of opaque quartz layers having different opacities. In addition, the number of transparent quartz parts and opaque quartz parts stacked or the number of opaque quartz parts stacked may be any number equal to or more than 2 and is not limited to 3.

That is, the susceptors shown in this example have a stack of n layers of light-transmitting materials (n is a natural number equal to or more than 2), and at least one of the n layers has an opacity to the flash light different from that of the other layers.

Table 4 shows a summary of the optimal voltage for flash light irradiation, the warpage of the thin film after irradiation, and the in-plane distributions of the optical properties (phase difference and transmittance) of the region of the substrate for formation of the phase-shift film before and after the irradiation processing for the cases where the susceptors of type 1 (FIG. 7A) and type 2 (FIG. 7B) according to the present invention are used in the flash light processing of the half-tone film.

For comparison, Table 4 contains the result for the conventional transparent susceptor (see FIG. 1A).

[Table 4]

TABLE 4

| Susceptor | | Optimal voltage for flash light irradiation (V) | Warpage of thin film (μm) | Phase difference (deg.) | Transmittance (%) |
|---|---|---|---|---|---|
| Conventional type | Before irradiation | 3600 | | 1.18 | 0.05 |
| | After irradiation | | −0.04 | 1.82 | 0.34 |
| | Δ | | | 0.64 | 0.29 |
| Type 1 | Before irradiation | 3000 | | 0.62 | 0.09 |
| | After irradiation | | −0.15 | 0.71 | 0.2 |
| | Δ | | | 0.09 | 0.11 |
| Type 2 | Before irradiation | 3100 | | 0.67 | 0.09 |
| | After irradiation | | −0.06 | 0.83 | 0.21 |
| | Δ | | | 0.16 | 0.12 |

The conditions of flash light irradiation are as follows. First, on a 6-inch rectangular quartz substrate, a half-tone phase-shift film of MOSiON was deposited to a thickness of 700 Å by reactive DC sputtering. The phase-shift film has a phase difference of 180 degrees with respect to the exposure light from an ArF excimer laser (193 nm) and has a transmittance that is approximately 6% of that of the bare substrate. Then, the substrate (that is, the phase-shift film) was heated to 80 degrees Celsius and irradiated with light from a xenon flash lamp.

As can be seen from the results summarized in Table 4, by using the susceptors according to the present invention, the optimal voltage for flash light irradiation, which corresponds to the energy of the irradiation light during the flash light processing, is substantially reduced compared with the conventional susceptor. In addition, it can be seen that the degradation of the distributions of the optical properties of the half-tone phase-shift film caused by the flash light irradiation is substantially reduced.

EXAMPLE 4

Structure 2 of Susceptor

As with Example 3, this example relates to a structure of a susceptor on which a substrate is mounted during flash light irradiation, which is intended to reduce particles generated during flash light irradiation by reducing the reflection of the light of a flash lamp from a susceptor. In addition to this advantage, this example has another advantage that an abnormality in the optical property of a region of an optical film close to the periphery of a substrate can be reduced.

Figure 8A:
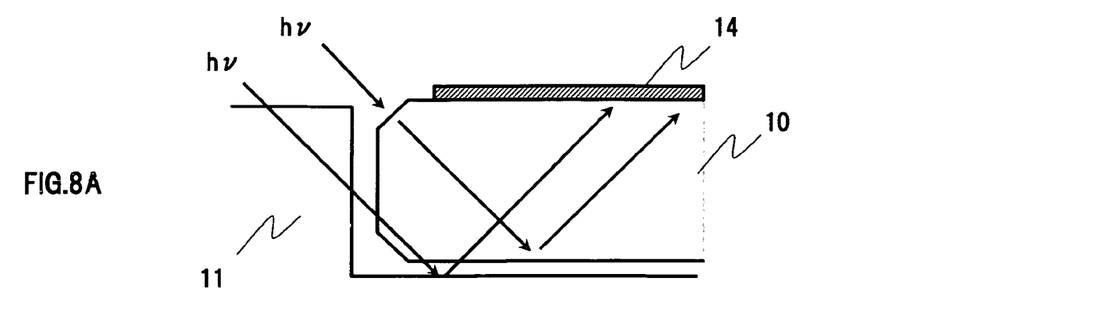
FIG. 8A is a cross-sectional view for illustrating a behavior of flash light in the vicinity of an edge of a substrate 10 irradiated with the flash light.
Figure 8B:
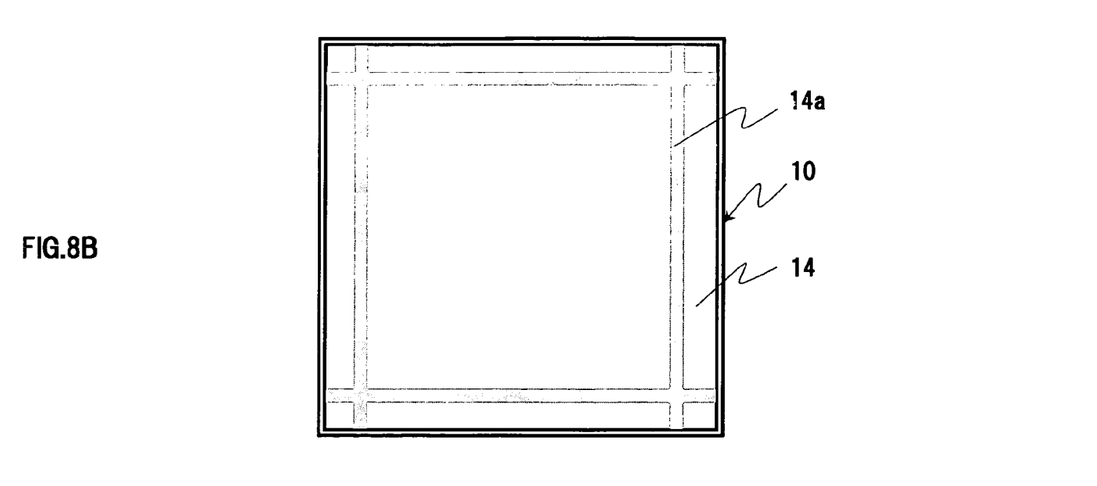
FIG. 8B is a plan view of phase-shift film formed on a principal plane of the substrate showing a region of the phase-shift film in which an abnormality occurs in the optical property when incidence or reflection of the flash light occurs as shown in FIG. 8A.
Figure 8C:
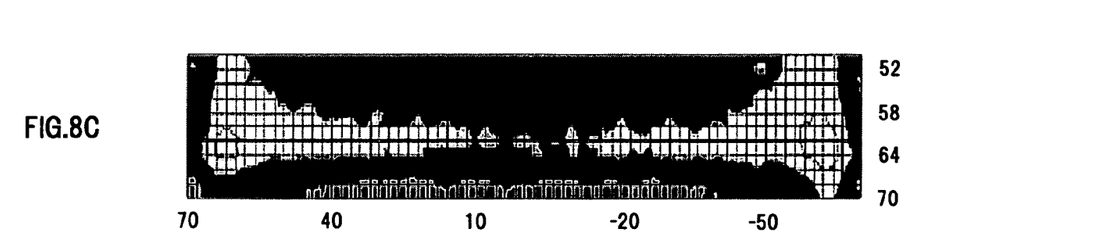
FIG. 8C shows a mapping of an optical property distribution of the region of the phase-shift film close to the periphery of the substrate shown in FIG. 8B.

FIG. 8A is a cross-sectional view for illustrating a behavior of flash light in the vicinity of an edge of a substrate 10 irradiated with the flash light, FIG. 8B is a plan view of phase-shift film formed on a principal plane of the substrate 10 showing a region of the phase-shift film in which an abnormality occurs in the optical property when incidence or reflection of the flash light occurs as shown in FIG. 8A, FIG. 8C shows a mapping of an optical property distribution of the region of the phase-shift film close to the periphery of the substrate shown in FIG. 8B.

As shown in FIG. 8A, typically, the edge of the substrate 10 is chamfered into a tapered shape in order to prevent cracking or the like during fabrication of a photomask-blank (and during use of a photomask).

During flash light irradiation, the substrate is irradiated not only with the perpendicular irradiation light as shown in FIGS. 6A and 6B but also with oblique irradiation light as shown in this drawing. The flash light incident on the tapered edge of the substrate 10 is reflected from the back surface of the substrate 10, and the back surface of a thin film (a phase-shift film 14 in this example) formed on the principal plane of the substrate 10 is irradiated with the reflection light.

In addition, in addition to the flash light obliquely incident on the tapered edge of the substrate 10, the flash light obliquely incident on a susceptor 11, which is made only of transparent quartz, is also reflected from the surface of an excavation of the susceptor 11 and applied to the phase-shift film 14.

That is, the region close to the periphery of the substrate 10 is irradiated with more flash light than the other regions.

In the region imparted with more energy than the other regions, an abnormality more easily occurs in the optical property of the phase-shift film. For example, as shown in FIG. 8B, in the vicinity of the tapered parts formed along the four sides of the substrate 10, an abnormal optical property region 14a occurs in the shape of bands extending in parallel with the sides of the substrate.

Figure 9A:
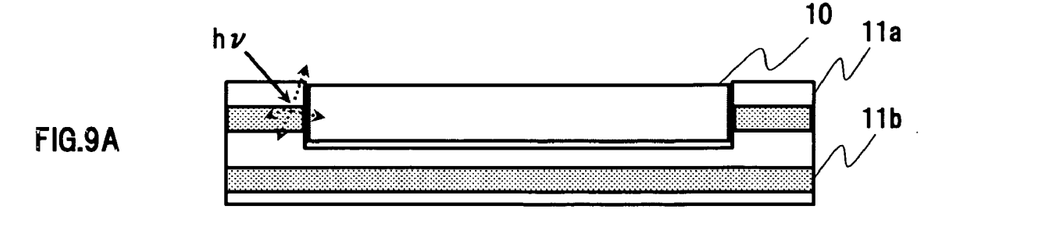
FIGS. 9A to 9C are diagrams for illustrating diffuse reflection of oblique incident flash light for different susceptors according to the present invention that have an excavation serving as a base on which a substrate is mounted.
Figure 9B:
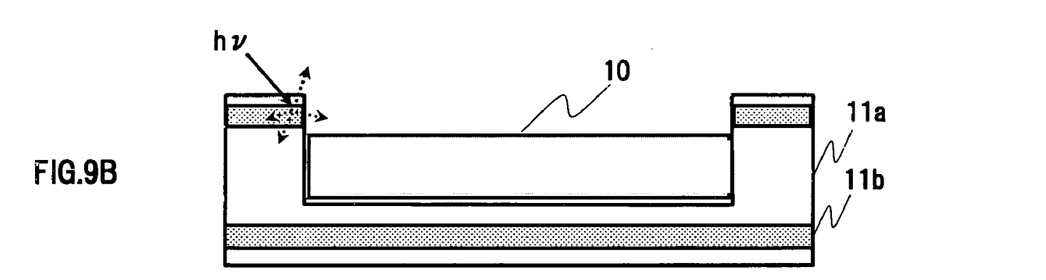

On the other hand, in the case where the susceptor according to the present invention that has a structure in which the excavation serves as a base on which the substrate is mounted as shown in FIGS. 7B and 7C is used, as shown (by hv) in FIGS. 9A and 9B, the oblique incident flash light is diffuse-reflected from an opaque quartz part 11b in the side wall part surrounding the excavation of the susceptor 11.

Thus, the flash light is reduced that is incident directly on the chamfered tapered edge of the substrate 10 and reflected from the back surface of the substrate 10, and the flash light can be reduced that is obliquely incident on the side wall part of the susceptor 11, applied directly to the surface of the excavation of the susceptor 11 and then reflected therefrom into the substrate. Thus, the excessive optical energy imparted to the thin film by the light that is incident on the back surface of the thin film on the principal plane of the substrate 10 is reduced.

This effect can be made more remarkable if the side wall part of the susceptor 11 holding the substrate 10 has a height from the excavation that is greater than the thickness of the substrate 10 as shown in FIG. 9B. This is because the diffuse reflection of the flash light from the opaque quartz part 11b described above occurs at a level higher than the upper surface of the substrate 10.

Figure 9C:
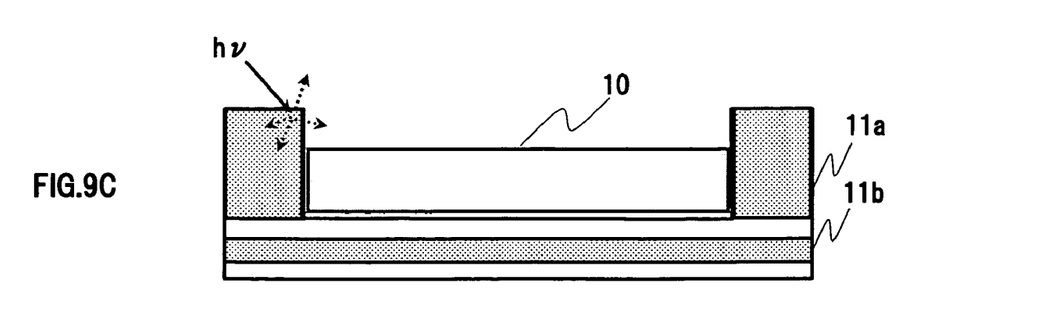

Of course, the position of the opaque quartz part 11b serving as a diffuse reflector in the susceptor 11 and the thickness of the opaque quartz part 11b are appropriately determined so that the effect described above is enhanced. For example, as shown in FIG. 9C, the entire side wall part may be made of opaque quartz glass.

Figure 10A:
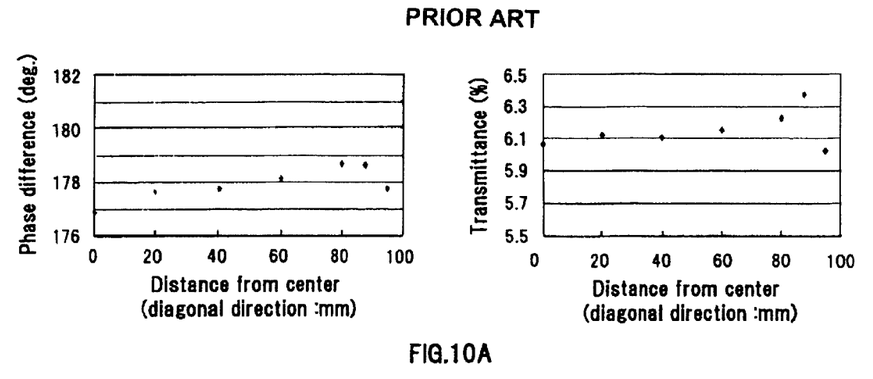
FIGS. 10A and 10B are diagrams for illustrating in-plane profiles of optical properties (phase difference and transmittance) of the phase-shift film after flash light irradiation in the cases where the conventional transparent susceptor (see FIG. 1A) and the susceptor of type 2 according to the present invention (see FIG. 9B) are used in the flash light irradiation, respectively.
Figure 10B:
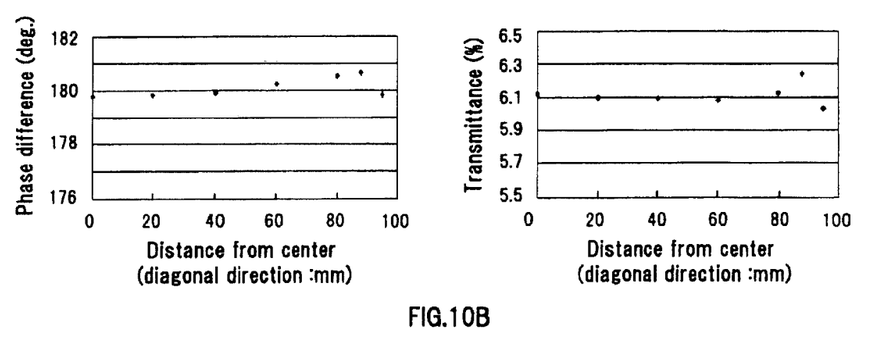

FIGS. 10A and 10B are diagrams for illustrating in-plane profiles of optical properties (phase difference and transmittance) of the phase-shift film after flash light irradiation in the cases where the conventional transparent susceptor (see FIG. 1A) and the susceptor of type 2 according to the present invention (see FIG. 9A) are used in the flash light irradiation, respectively.

As can be seen from the results shown in these drawings, if the susceptor according to the present invention is used, the level of abnormality in the optical properties occurring in the region close to the periphery of the substrate 10 is reduced.

As described earlier, in order to avoid accumulation of particles in the chamber, it is extremely effective to clean the substrate when it is introduced into the chamber for the flash light irradiation.

According to prior art, sulfuric acid/hydrogen peroxide, ammonia/hydrogen peroxide, acidic surfactant or the like is used as a cleaning fluid to remove a foreign material, such as an organic or metallic material, from a fine substrate surface. However, in order to avoid the degradation of the quality of the substrate, ozone water is effective for cleaning. Thus, the so-called "UV/ozone cleaning", in which the cleaning fluid is irradiated with ultraviolet (UV) rays to generate ozone, is preferably performed.

For example, an organic material deposited on the substrate surface is decomposed by $VUV/O_3$ cleaning using light having a central wavelength of 172 nm emitted from a dielectric barrier discharge excimer lamp, large stains are physically cleaned by scrubbing, finer submicron-size stains are removed by applying a high frequency to ultrapure water added with functional water, and then the substrate is rinsed with ultrapure water and finally spin-dried.

Techniques involved in fabrication of a photomask-blank according to the present invention have been described above with regard to examples. However, those examples are intended only for illustrating the implementation of the present invention, and the present invention is not limited thereto.

Figure 11A:
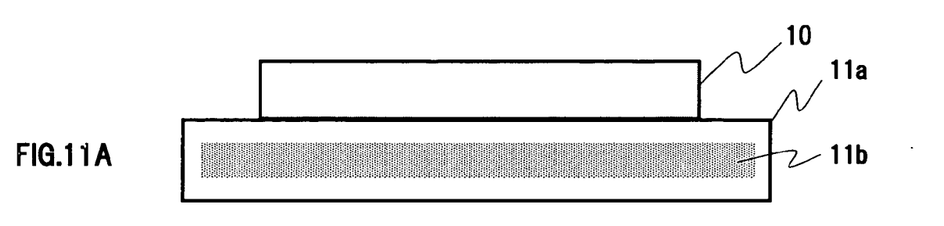
FIGS. 11A and 11B are diagrams for illustrating "multi-layer" susceptor structure formed by coating the surface of a layer having a relatively low transmittance with a layer having a relatively high transmittance.
Figure 11B:
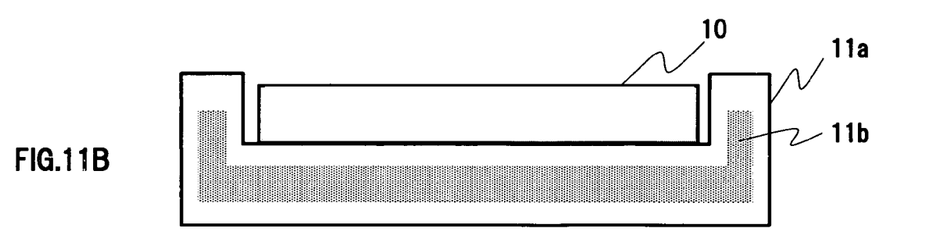

For example, the susceptor according to the present invention has a multilayer structure in which a plurality of layers of light-transmitting materials are stacked. However, the word "multilayer" used herein can include an effectively multilayered structure in which the surface of a layer (11b) having a relatively low transmittance is coated with a layer (11a) having a relatively high transmittance as shown in FIGS. 11A and 11B or the surface of a single layer is thermally or otherwise reformed to change the opacity of the surface.

Various modifications of the examples are included in the scope of the present invention, and it is obvious from the above description that other various examples are possible within the scope of the present invention.

The present invention provides a fabrication method of a photomask-blank that has a reduced number of particle-caused defects.

The invention claimed is:

1. A fabrication method of a photomask-blank, comprising:
    a step of irradiating an optical film formed on a transparent substrate with flash light,
    wherein said irradiation is performed with said transparent substrate being mounted on a substrate supporting member made of a glass material that is opaque to said flash light, said substrate supporting member has a stack structure having n layers of light-transmitting materials (n is a natural number equal to or greater than 2), and at least one of the n layers has an opacity to said flash light that is different from that of the other layers.

2. The fabrication method of a photomask-blank according to claim 1, wherein said stack structure comprises a stack of a layer that is transparent to said flash light and a layer that is opaque to said flash light.

3. The fabrication method of a photomask-blank according to claim 1, wherein said substrate supporting member is opaque quartz glass.

4. The fabrication method of a photomask-blank according to claim 2, wherein said opaque layer is made of foamed glass.

5. The fabrication method of a photomask-blank according to claim 1, wherein over a wavelength range of 300 to 600 nm, the opacity of said substrate supporting member to said flash light is equal to or higher than 10% in terms of reflectance measured using an integrating sphere.

6. The fabrication method of a photomask-blank according to claim 1, wherein said substrate supporting member has a maximum surface roughness ($R_{max}$) of 15 μm or less.

7. The fabrication method of a photomask-blank according to claim 1, wherein said optical film is a phase-shift film.

8. A fabrication method of a photomask-blank, comprising:
    a step of irradiating an optical film formed on a transparent substrate with flash light,
    wherein said irradiation is performed with said transparent substrate being mounted on a substrate supporting member, the substrate supporting member having an excavation and a side wall part surrounding the excavation, and the side wall part being made of a glass material that is opaque to the flash light applied to said optical film, a substrate mounting region of said excavation has a stack structure having n layers of light-transmitting materials (n is a natural number equal to or greater than 2), and at least one of the n layers has a transmittance to said flash light that is different from that of the other layers.

9. The fabrication method of a photomask-blank according to claim 8, wherein the height of the side wall part of said substrate supporting member from said excavation is equal to or greater than the thickness of said substrate.

10. The fabrication method of a photomask-blank according to claim 8, wherein said side wall part is composed of a stack of a layer that is transparent to said flash light and a layer that is opaque to said flash light.

11. The fabrication method of a photomask-blank according to claim 8, wherein said substrate supporting member is opaque quartz glass.

12. The fabrication method of a photomask-blank according to claim 8, wherein over a wavelength range of 300 to 600 nm, the opacity of the substrate mounting region of said excavation to said flash light is equal to or lower than 85% in terms of transmittance measured using an integrating sphere.

13. The fabrication method of a photomask-blank according to claim 8, wherein said substrate supporting member has a maximum surface roughness ($R_{max}$) of 15 μm or less.

14. The fabrication method of a photomask-blank according to claim 8, wherein said optical film is a phase-shift film.

* * * * *